United States Patent
Nakamura

(10) Patent No.: US 6,653,230 B2
(45) Date of Patent: Nov. 25, 2003

(54) SEMICONDUCTOR DEVICE HAVING CONCAVE ELECTRODE AND CONVEX ELECTRODE AND METHOD OF MANUFACTURING THEREOF

(75) Inventor: Ryoichi Nakamura, Tokyo (JP)

(73) Assignees: NEC Corporation, Tokyo (JP); NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/119,023

(22) Filed: Apr. 10, 2002

(65) Prior Publication Data

US 2002/0110977 A1 Aug. 15, 2002

Related U.S. Application Data

(62) Division of application No. 09/498,640, filed on Feb. 7, 2000, now abandoned.

(30) Foreign Application Priority Data

Feb. 10, 1999 (JP) .............................. 11-32177

(51) Int. Cl.[7] .......................................... H01L 21/4763
(52) U.S. Cl. ..................... 438/638; 438/239; 438/253; 438/255; 438/396; 438/398; 257/306; 257/309; 257/532
(58) Field of Search ................................ 438/638, 255, 438/398, 253, 396; 257/239, 306, 309, 532

(56) References Cited

U.S. PATENT DOCUMENTS 5,770,498 A * 6/1998 Becker ..................... 438/239
5,874,756 A * 2/1999 Ema et al. ................. 257/296
6,087,694 A * 7/2000 Ohno et al. ................ 257/306

FOREIGN PATENT DOCUMENTS

| JP | A64-41262 | 2/1989 |
|----|-----------|--------|
| JP | 4-162565 | 6/1992 |
| JP | 4-168765 | 6/1992 |
| JP | 4-266060 | 9/1992 |
| JP | 5-243517 | 9/1993 |
| JP | 7-254648 | 10/1995 |
| JP | A 8-236717 | 9/1996 |
| JP | A 8-74278 | 10/1996 |
| JP | 8-306881 | 11/1996 |
| JP | 9-139478 | 5/1997 |
| JP | 11-17129 | 1/1999 |

OTHER PUBLICATIONS

Masami Aoki et al., "Fully Self–Aligned 6F[2] Cell Technology for Low Cost 1Gb DRAM", 1996, *Symposium on VLSI Technology Digest of Technical Papers*, pp. 22–23. IEEE.

* cited by examiner

Primary Examiner—Matthew Smith
Assistant Examiner—B. V. Keshavan
(74) Attorney, Agent, or Firm—Young & Thompson

(57) ABSTRACT

It is intended to enable simultaneous formation of concave capacitor storage electrodes and a convex bit contact plug electrode and thereby makes it possible to reduce spaces of margins for alignment errors by decreasing the number of lithography steps. Gate electrodes are formed on a p-well in such a manner that the gate electrode interval in storage electrode forming portions is longer than that in a bit contact plug forming portion, and sidewalls are then formed. An $SiO_2$ film is deposited, storage electrode forming holes and a bit contact plug forming holes are formed therein, and then a polysilicon film is deposited. Another $SiO_2$ film is deposited on the polysilicon film and etched back. Then, the polysilicon film is etched back. After etching of the $SiO_2$ films, capacitor insulating films and counter electrodes are formed and a bit line is also formed.

8 Claims, 17 Drawing Sheets

2 DEVICE ISOLATION OXIDE FILM
7 GATE ELECTRODE
8 SOURCE/DRAIN DIFFUSION LAYER
9 SIDEWALL
13 STORAGE ELECTRODE
14 BIT CONTACT PLUG
17 COUNTER ELECTRODE

19 TUNGSTEN FILM

- 2  DEVICE ISOLATION OXIDE FILM
- 7  GATE ELECTRODE
- 8  SOURCE/DRAIN DIFFUSION LAYER
- 9  SIDEWALL
- 13  STORAGE ELECTRODE
- 14  BIT CONTACT PLUG
- 17  COUNTER ELECTRODE 1  p-WELL REGION
3  GATE OXIDE FILM
4  POLYSILICON FILM
5  TUNGSTEN SILICIDE FILM
6  SiN FILM
10 SiO$_2$ FILM

11 POLYSILICON FILM
12 $SiO_2$ FILM

15 CAPACITOR INSULATING FILM
16 POLYSILICON FILM
18 SiO2 FILM

19 TUNGSTEN FILM

20 AMORPHOUS SILICON FILM

21 HSG LAYER

22  AMORPHOUS SILICON FILM
23  HSG LAYER

24 POLYSILICON FILM

SEMICONDUCTOR DEVICE HAVING CONCAVE ELECTRODE AND CONVEX ELECTRODE AND METHOD OF MANUFACTURING THEREOF

This application is a division of application Ser. No. 09/498,640, filed on Feb. 7, 2000, now abandoned, the entire contents of which are hereby incorporated by reference.

BACKGROUND OF THE INVENTION

1. Field of the Invention

The present invention relates to a semiconductor device having concave electrode and convex electrode and method of manufacturing thereof; and especially relates to semiconductor device having concave capacitor electrode and convex wiring electrode and method of manufacturing thereof in a DRAM (Dynamic Random Access Memory) etc.

2. Description of the Related Art

In typical DRAMs, each memory cell comprises one MOS (Metal Oxide Semiconductor) transistor and one capacitor for storing information. To secure larger capacitance, the technique in which the storage electrode portion of the capacitor is given a cylinder shape is widely employed.

FIG. 15 is a plan view showing the structure of a DRAM memory cell portion having a cylinder-shaped capacitor which is proposed in Symposium on VLSI Technology Digest of Technical Papers, pp. 22–23, 1996.

As shown in FIG. 15, gate electrodes 7 having sidewalls 9 on their side faces are formed so as to extend in the top-bottom direction in the figure. Source/drain diffusion layers 8 are formed between the gate electrodes 7 so as to be interposed between device isolation oxide films 2. Cylinder-shaped storage electrodes 13 and a bit contact plug 14 are formed on and connected to the respective source/drain diffusion layers 8. A counter electrode 17 is formed on each storage electrode 13 via a capacitor insulating film (not shown).

In the conventional example shown in FIG. 15, all the intervals between the gate electrodes 7 are substantially the same. That is, the conventional example is designed in such a manner that the interval between the gate electrodes 7 on both sides of the bit contact plug 14 is equal to the interval between the gate electrodes 7 on both sides of each storage electrode 13. And the diameters of the storage electrodes 13 and the bit contact plug 14 are set approximately the same.

A manufacturing process of this conventional example will be described below with reference to FIGS. 16 to 18 which are sectional views taken along line XIV~X VIII—X IV~X VIII in FIG. 15 and arranged in order of steps.

As shown in FIG. 16A, device isolation oxide films (not shown) and gate oxide films 3 are formed on a p-well region 1 and gate electrodes 7 whose top surfaces are covered with SiN films 6 are formed thereon. All the intervals between the gate electrodes 7 are substantially the same. Then, source/drain diffusion layers 8 are formed by doping of an n-type impurity. Then, sidewalls 9 are formed on the side faces of the laminated films each having a gate electrode 7 and a SiN film 6.

Then, as shown in FIG. 16B, an $SiO_2$ film 10 is deposited over the entire surface and subjected to anisotropic dry etching, whereby holes for exposing the surfaces of the respective source/drain diffusion layers 8 are formed.

Thereafter, as shown in FIG. 17A, a phosphorus-doped polysilicon film 11 and an $SiO_2$ film 12 are deposited over the entire surface. Then, as shown in FIG. 17B, the portion of the $SiO_2$ film 12 in a bit contact plug forming region is removed selectively and a phosphorus-doped polysilicon film 24 is deposited over the entire surface.

Thereafter, as shown in FIG. 18A, the polysilicon film 24 is etched back so that its residual portion is buried in the portion of the polysilicon film 11 in the bit contact plug forming region. Then, as shown in FIG. 18B, after removing the top portions of the polysilicon films 11 and 24 by etching, the $SiO_2$ films 10 and 12 are removed by etching, whereby cylinder-shaped storage electrodes 13 and a bit contact plug 14 are formed.

Although not shown in figures, subsequently, capacitor insulating films and counter electrodes are formed on the surfaces of the respective storage electrodes 13 and the entire surface is covered with an interlayer insulating film. Then, a bit line that is connected to the bit contact plug 24 is formed.

With the recent miniaturization and increased integration densities of semiconductor devices, the intervals between constituent elements such as contacts and gate electrodes have become very small. Therefore, to increase margins for mask alignment errors in photolithography steps, processes using self-alignment have become very important. Further, to reduce the manufacturing cost of DRAMs etc. and shorten the TAT (Turn Around Time), how to decrease the number of times of use of photolithography is an important theme.

In the conventional manufacturing process described above, a cylinder shape is also formed in a bit contact plug forming portion in depositing a polysilicon film 11 to form cylinder-shaped storage electrodes 13 (see FIG. 17A). Therefore, to form a plug, it is necessary to form holes in $SiO_2$ film 12, deposit a phosphorus-doped polysilicon film again, and fill in the hole of the cylinder structure in the bit contact plug forming portion. That is, in the above described conventional manufacturing process, to fill in the hole in the bit contact plug forming portion, it is necessary to additionally execute (1) the photolithography step, (2) the step of selectively etching an $SiO_2$ film 12, (3) the step of depositing a polysilicon film 24, and (4) the step of etching back the polysilicon film 24.

SUMMARY OF THE INVENTION

An object of the present invention is to overcome the problems existing in the conventional technology to provide a novel semiconductor device and the novel manufacturing method of the semiconductor.

According to one aspect of the invention, there is provided a semiconductor device comprising:

a semiconductor substrate;

a convex electrode formed on said semiconductor substrate;

a first concave electrode formed on said semiconductor substrate, said first concave electrode made of the same layer to said convex electrode, and said first concave electrode having an external diameter greater than an external diameter of said convex electrode; and a first transistor formed on said semiconductor substrate between said convex electrode and said first concave electrode, and connected said convex electrode and said first concave electrode.

According to another aspect of the invention, there is provided a method of manufacturing a semiconductor device comprising:

forming AMOS transistor on the semiconductor substrate;

forming a spacer layer on said transistor and said semiconductor substrate;

opening a first and a second windows from surface of said spacer layer to a source and a drain regions of said MOS transistor, the internal diameter of said first window being greater than the internal diameter of said second window;

forming a conductive layer on said spacer layer and the inside of said first and second windows so as to fill up the inside of said second window by said conductive layer and to remain concave hollow portion in said first window; and removing said conductive layer on said spacer layer and said spacer layer to form a concave electrode by said conductive layer in said first window and a convex electrode by said conductive layer in said second window.

In the invention, in forming holes or windows for forming a concave storage electrode and a convex bit contact plug electrode in a spacer film (i.e., $SiO_2$ film 10), the diameter of a hole or window for forming the storage electrode is set larger than that of a hole or window for forming the bit contact plug. This makes it possible to form a polysilicon film in the holes for formation of concave storage electrodes and a convex bit contact plug electrode in such a manner that the hole or window for forming the convex bit contact plug electrode is completely filled with the polysilicon film but the hole or window for forming the concave storage electrode are not completely filled with the polysilicon film. That is, whereas cylinder-shaped concave polysilicon films are formed in the hole for forming the respective concave storage electrode forming holes, the hole for forming the convex bit contact plug is completely filled with polysilicon.

Therefore, the invention can prevent formation of a hole in the polysilicon film in the bit contact plug forming portion and hence can omit a photolithography step for filling in the hole, a selective etching step, a polysilicon deposition step, and a polysilicon etch back step, etc for filling up the hole to form the bit contact plug. This enables reduction of the manufacturing cost, increase of the production yield, and shortening of the TAT. Further, decreasing the number of photolithography steps, the invention dispenses with margins for errors of mask alignment that is necessary for photolithography. The invention can thus provide a structure and a manufacturing method that are advantageous in increasing the integration density.

These and other object of the present invention will be apparent to those of skill in the art from the appended claims when read in light of the following specification and accompanying figures.

DETAILED DESCRIPTION OF THE PREFERRED EMBODIMENTS

Embodiments of the present invention will be hereinafter described in detail with reference to the accompanying drawings.

First Embodiment

Figure 1:
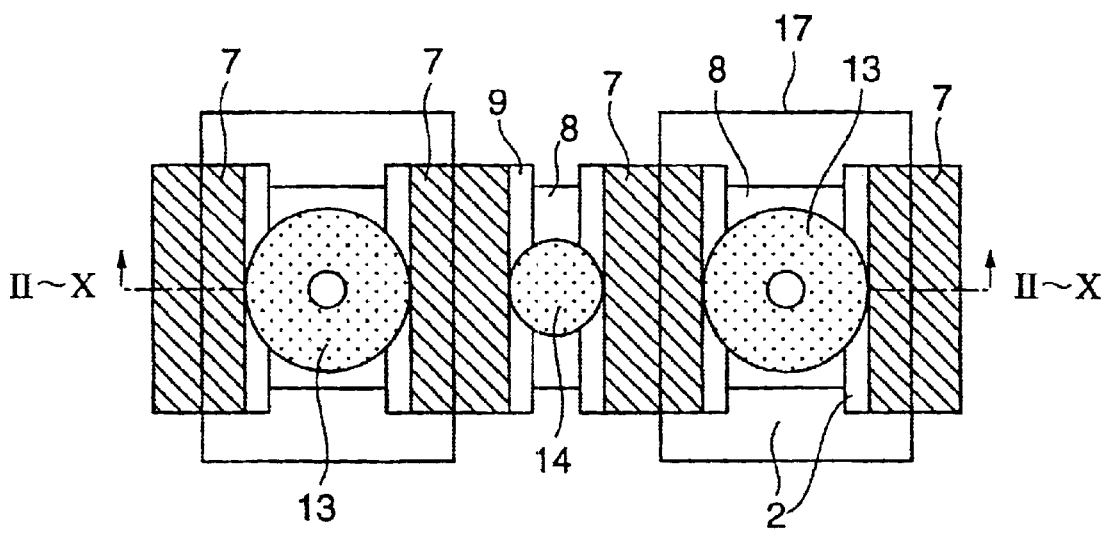
FIG. 1 is a plan view of a semiconductor device according to a first embodiment of the present invention.
Figure 7:
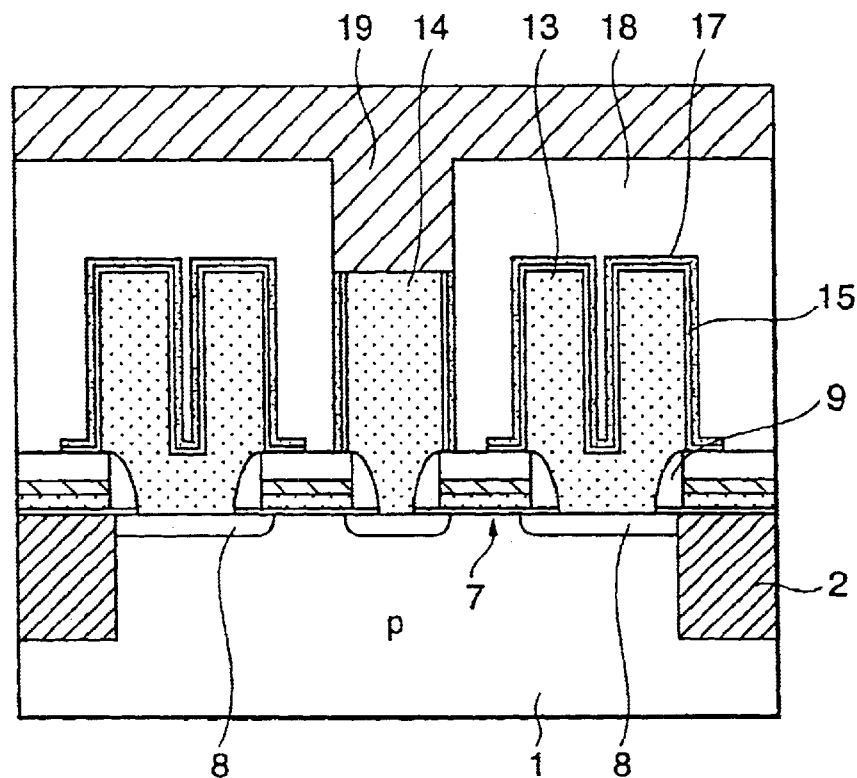

FIGS. 1 and 7 are a plan view and a sectional view of a semiconductor device according to a first embodiment of the present invention. As shown in FIG. 1 and 7, gate electrodes 7 having sidewalls 9 on their side faces are formed so as to extend in the top-bottom direction in the FIG. 1. The two central gate electrodes 7 are formed on active regions and the gate electrodes 7 of the right end and the left end are formed on device isolation oxide films 2. The interval between the two gate electrodes 7 on the active regions is set shorter than the interval between each gate electrode 7 on the active region and the corresponding gate electrode 7 on the device isolation oxide film 2. Source/drain diffusion layers 8 are formed between the gate electrodes 7 so as to be interposed between the device isolation oxide films 2 in the top-bottom direction in FIG. 1. A convex bit contact plug electrode 14 and cylinder-shaped concave storage electrodes 13 are formed on and connected to the respective source/drain diffusion layers 8. As shown in FIG. 1, the diameter of the storage electrodes 13 is set larger than that of the bit contact plug 14. A counter electrode 17 is formed on each storage electrode 13 via a capacitor insulating film 15 in FIG. 7.

A manufacturing process of the semiconductor device of FIG. 1 will be described below with reference to FIGS. 2A to 7 that are sectional views taken along line II~X—II~X in FIG. 1 and arranged in order of steps.

Figure 2A:
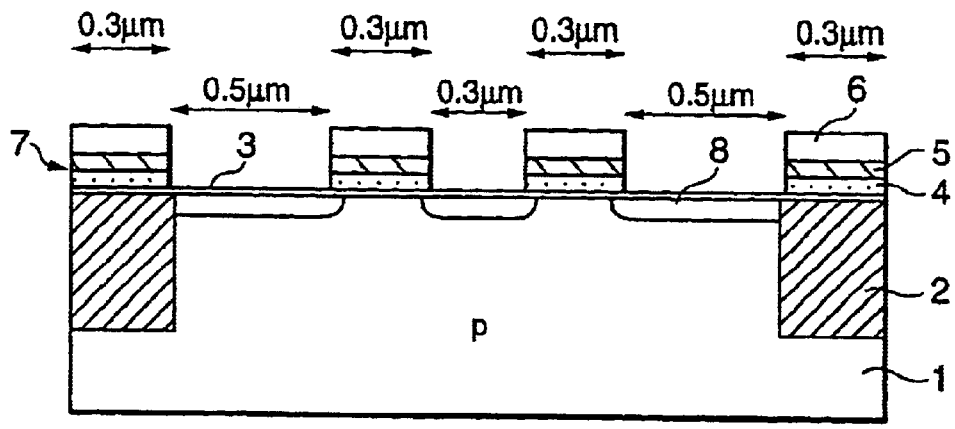
FIGS. 2 to 7 are sectional views arranged in order of steps and showing a manufacturing process according to the first embodiment of the invention.

As shown in FIG. 2A, 500-nm-thick device isolation oxide films 2 are formed on a p-well region 1 provided on a semiconductor substrate (not shown) by an isolation technique such as an STI (Shallow Trench Isolation) method or a LOCOS (Local Oxidation of Silicon) method. Then, a 10-nm-thick gate oxide film 3 is formed by thermal oxidation, and a 100-nm-thick polysilicon film 4, a 100-nm-thick tungsten silicide film (WSi film) 5, and a 200-nm-thick SiN film 6 are deposited thereon sequentially by CVD (Chemical Vapor Deposition). Then, gate electrodes 7 are formed by simultaneously patterning these three deposition films by photolithography. At this time, as shown in FIG. 2A, the length of each gate electrode 7 (i.e., gate length) is set at 0.3 $\mu$m, the distance between each gate electrode 7 on the device isolation oxide film 2 and the corresponding gate electrode 7 on the active region is set at 0.5 $\mu$m, and the distance between the two gate electrodes 7 on the active region is set at 0.3 $\mu$m. After the formation of the gate electrodes 7, source/drain diffusion layers 8 are formed by ion implantation of phosphorus or arsenic.

Figure 2B:
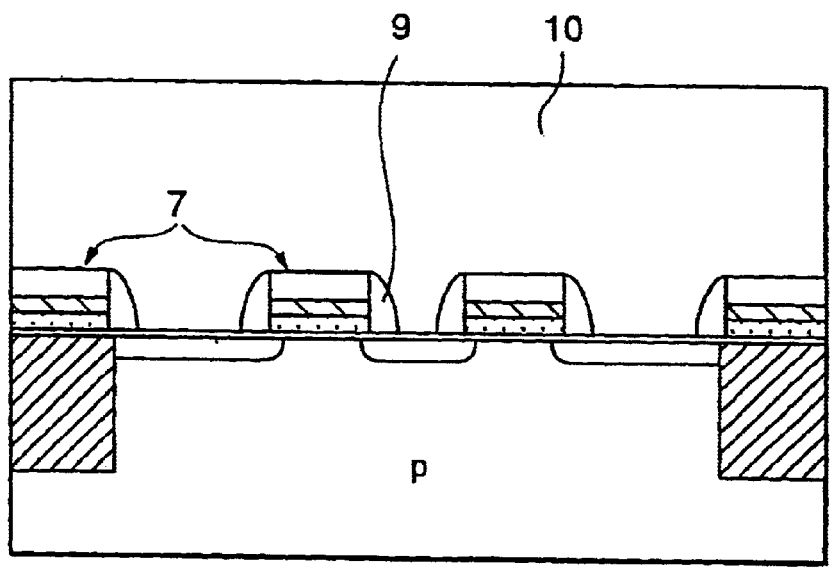

Thereafter, as shown in FIG. 2B, an SiN film is deposited over the entire surface by LP-CVD (low-pressure CVD) and etch back is performed on the entire surface, whereby sidewalls 9 having a width of 0.1 $\mu$m are formed on the side faces of the gate electrodes 7. Then, an SiO$_2$ film 10 is deposited by plasma CVD and its surface is planarized by CMP (Chemical Mechanical Polishing). The height of the planarized SiO$_2$ film 10 as measured from the diffusion layers 8 is set at about 750 nm.

Figure 3A:
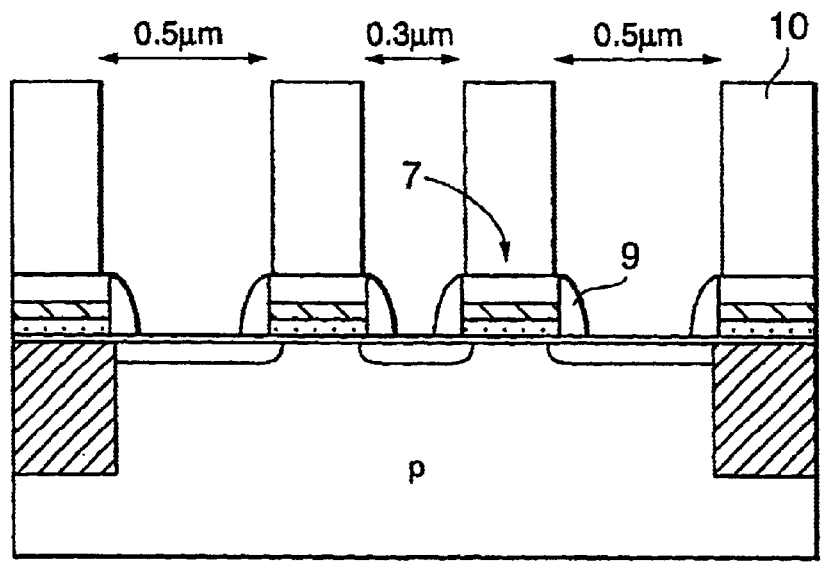

Thereafter, as shown in FIG. 3A, the portions of the SiO$_2$ film 10 in the regions where storage electrodes 13 and a bit contact plug 14 (see FIG. 1) are to be formed are removed selectively by photolithography and dry etching. The diameter of holes or windows for forming concave storage electrodes are set at 0.5 μm. Meanwhile, the diameter of a hole or window for forming a convex bit contact plug electrode is set at and 0.3 μm.

Figure 3B:
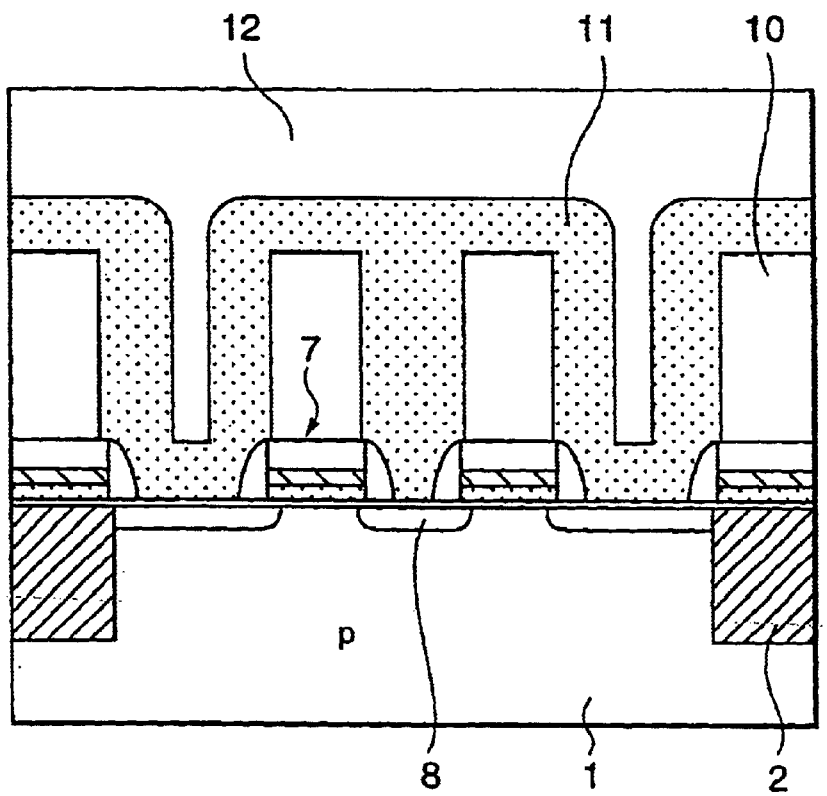

Then, as shown in FIG. 3B, a phosphorus-doped polysilicon film 11 is deposited at a thickness of 200 nm by LP-CVD. As a result, the polysilicon film 11 is formed in cylinder form in the holes for forming storage electrodes while the hole for forming the bit contact plug is completely filled with the polysilicon film 11. An SiO$_2$ film 12 is then deposited on the entire surface by plasma CVD.

Figure 4A:
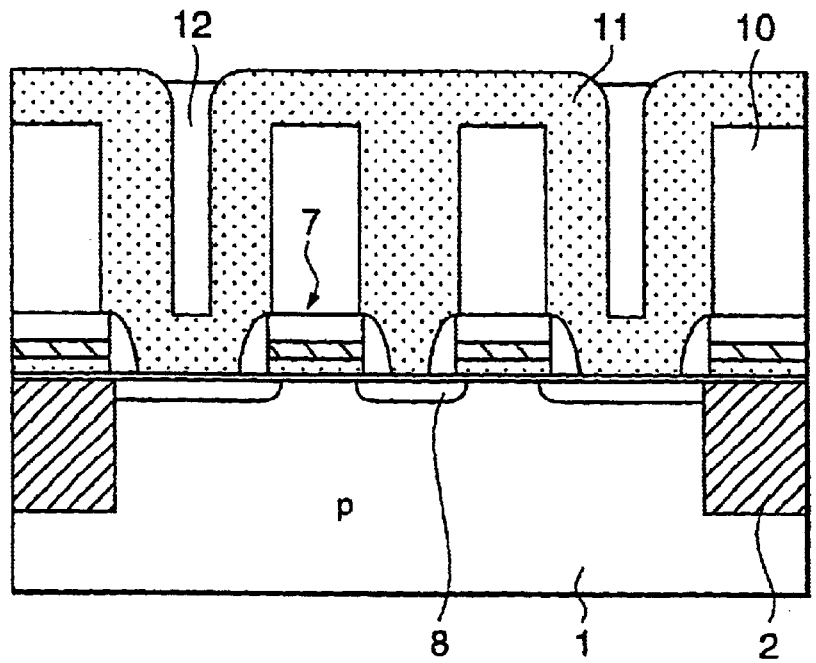
Figure 4B:
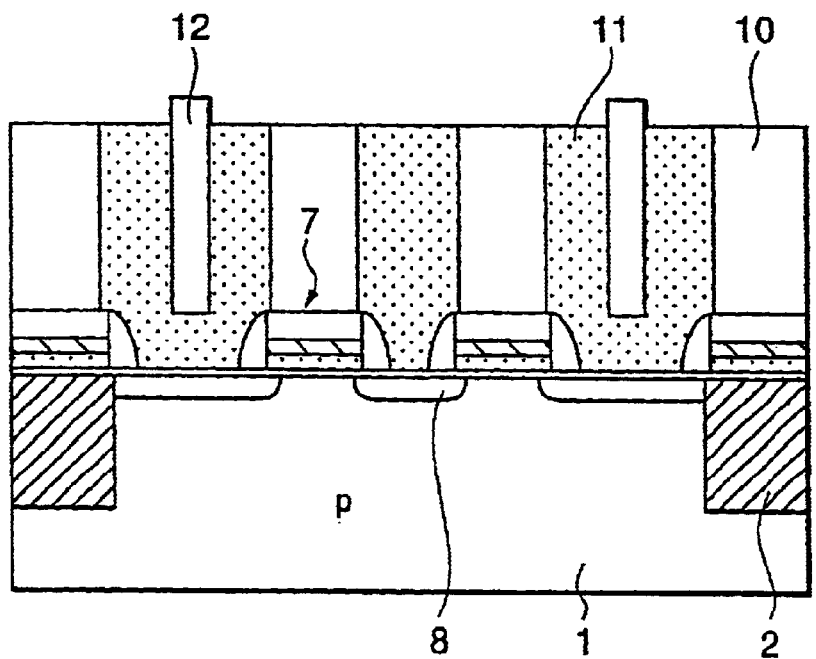

Then, as shown in FIG. 4A, etch back is performed on the entire surface of the SiO$_2$ film 12 until the surfaces of the polysilicon film 11 are exposed. Then, as shown in FIG. 4B, etch back is performed on the entire surfaces of the polysilicon film 11, whereby the surfaces of the SiO$_2$ films 10 are exposed.

Figure 5A:
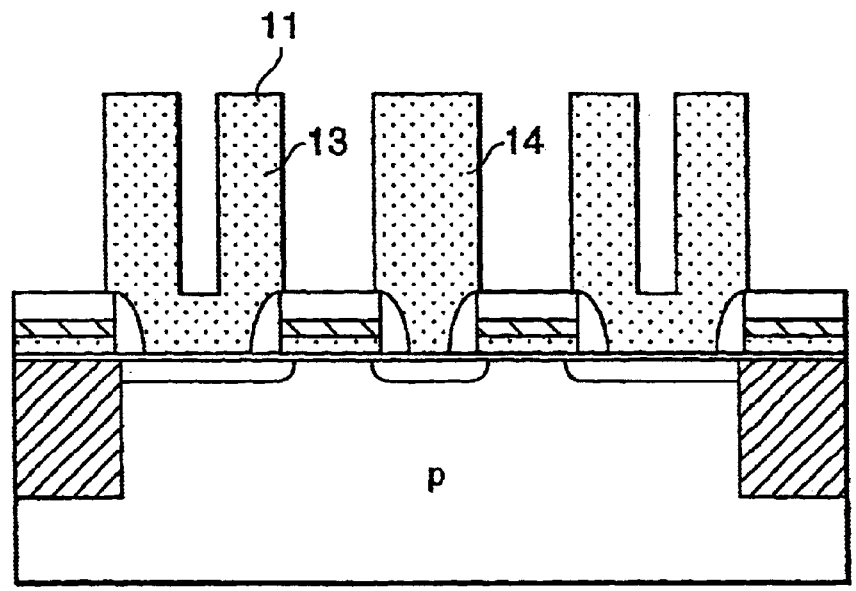

Subsequently, as shown in FIG. 5A, the residual portions of the SiO$_2$ films 10 and 12 are completely removed by wet etching. As a result, cylinder-shaped concave storage electrodes 13 and a convex bit contact plug electrode 14 are formed at the same time.

Figure 5B:
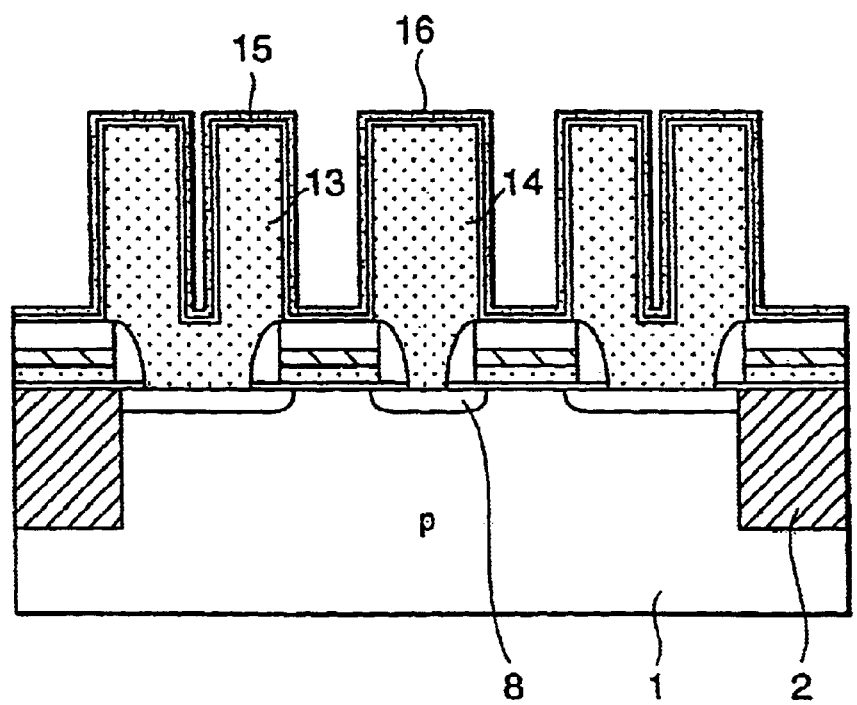
Figure 6A:
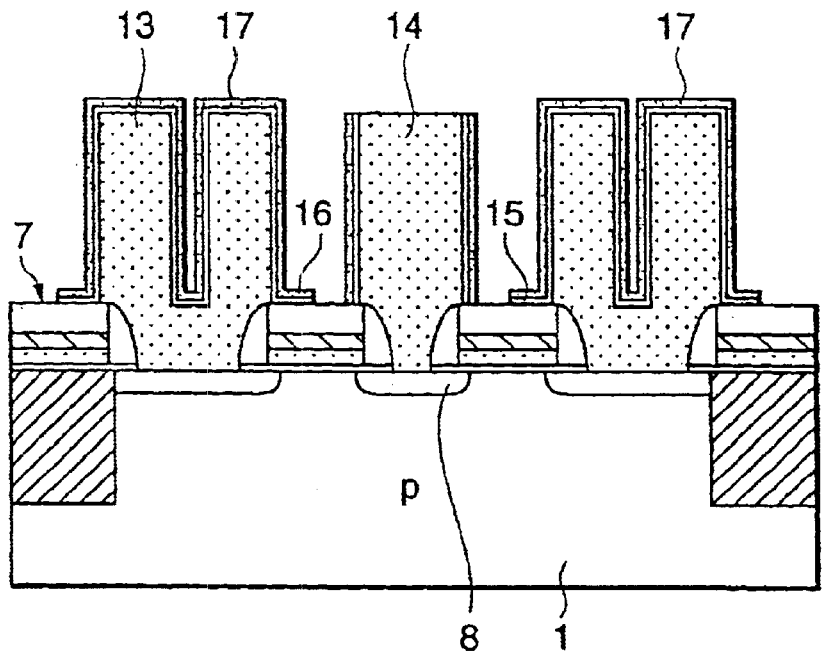

Then, as shown in FIG. 5B, a dielectric film or a capacitor insulating film 15 of about 7 nm in thickness is deposited and a phosphorus-doped polysilicon film 16 of about 40 nm in thickness is deposited thereon by LP-CVD. Then, as shown in FIG. 6A, counter electrodes 17 are formed and the top surface of the convex bit contact plug electrode 14 is exposed by patterning the polysilicon film 16 and the capacitor insulating film 15 by photolithography and dry etching. At this time, the portions of the polysilicon film 16 and the capacitor insulating film 15 that are formed on the side faces of the bit contact plug 14 may be removed by etching.

Figure 6B:
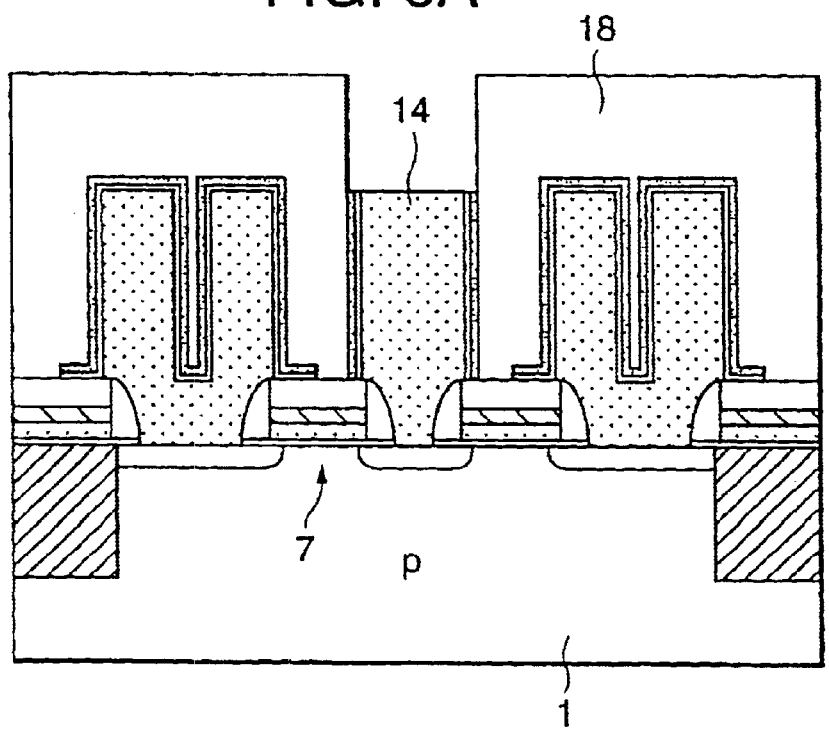

Thereafter, an SiO$_2$ film 18 is deposited by CVD by using TEOS (tetraethoxysilane: Si(OC$_2$H$_5$)$_4$) as a source gas and its surface is planarized by CMP. At this time, the thickness of the portion of the planarized SiO$_2$ film 18 above the top surface of the bit contact plug 14 is set at about 300 nm. Then, the SiO$_2$ film 18 is selectively removed by photolithography and dry etching, whereby a hole of 0.3 μm in diameter is formed that exposes the top surface of the bit contact plug 14 as shown in FIG. 6B.

Finally, as shown in FIG. 7, a tungsten film 19 is deposited by CVD and a bit line is formed by patterning the tungsten film 19 by photolithography. Thereby, the top area of the convex bit contact plug electrode 14 is selectively connected to the tungsten wiring layer 19.

Second Embodiment

Figure 8:
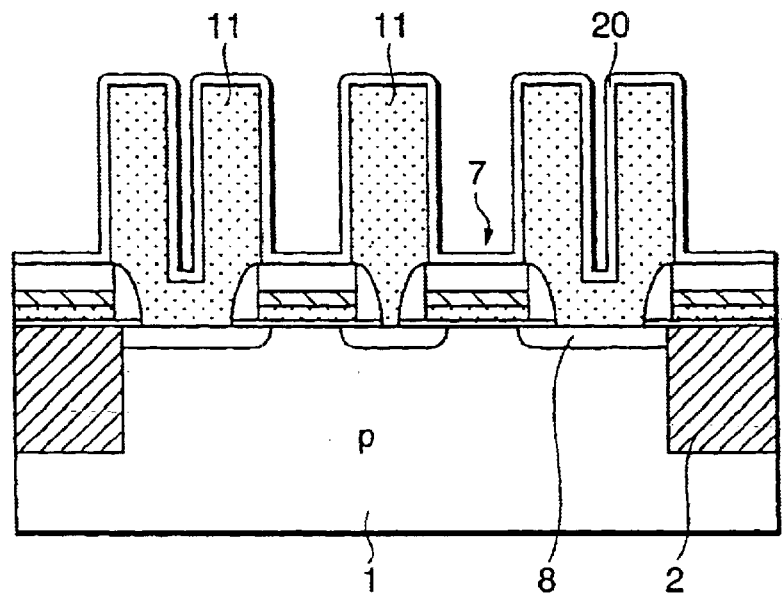
FIGS. 8 to 9 are sectional views arranged in order of steps and showing a manufacturing process according to a second embodiment of the invention.
Figure 9A:
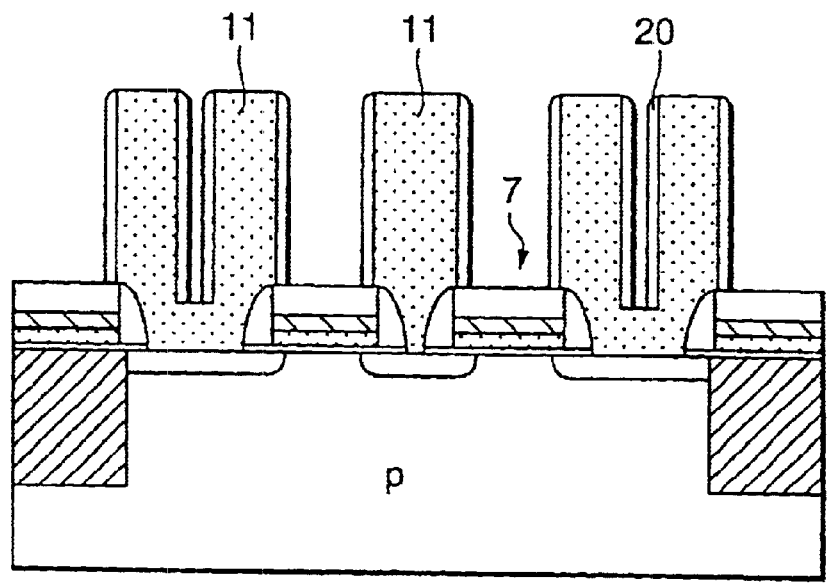
Figure 9B:
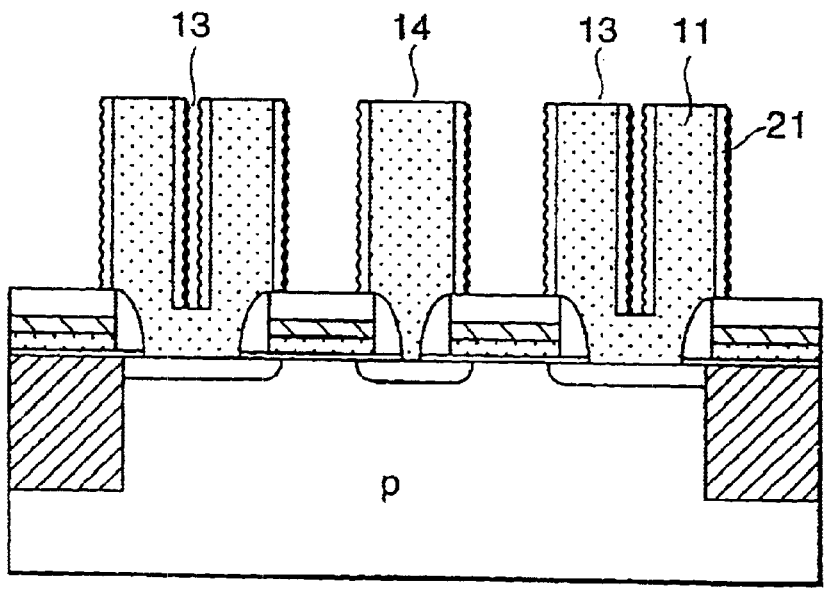

FIGS. 8 to 9B are sectional views that are arranged in order of steps and show a manufacturing process according to a second embodiment of the invention. A plan view of a semiconductor device according to the second embodiment is the same as the plan view (i.e., FIG. 1) of the semiconductor device according to the first embodiment, and the sectional views of FIGS. 8 to 9B are taken along line II~X—II~X in FIG. 1. In this embodiment, the steps to the one shown in FIG. 5A are the same as in the first embodiment except that the polysilicon film 11 is deposited at a thickness of about 180 nm rather than 200 nm in the first embodiment. After the processing has been made to reach the state of FIG. 5A, a 40-nm-thick phosphorus-doped amorphous silicon film 20 is deposited over the entire surface by LP-CVD as shown in FIG. 8. Then, as shown in FIG. 9A, etch back is performed on the entire surface to leave the portions of the amorphous silicon film 20 only on the side faces of the vertical portion of the polysilicon films 11.

Thereafter, HSG layers having fine asperity on their surfaces are formed on the side faces of the polysilicon films 11 by performing an HSG (Hemi-Spherical Grained Si) treatment. Specifically, after Si nuclei are formed on the surfaces of the amorphous silicon films 20 by inputting the wafer into a high-vacuum reaction furnace in which the temperature is increased to 550–570° C. and causing SiH$_4$ to flow for about 20 seconds, Si atoms in the amorphous silicon films 20 are accumulated on the Si nuclei by performing annealing in a high vacuum state. As a result, as shown in FIG. 9C, storage electrodes 13 and a bit contact plug 14 having HSG layers 21 on their side faces are formed.

Then, as in the first embodiment, capacitor insulating films, counter electrodes, an interlayer insulating film, and a bit line are formed as shown in FIG. 5B to FIG. 7.

Third Embodiment

Figure 10A:
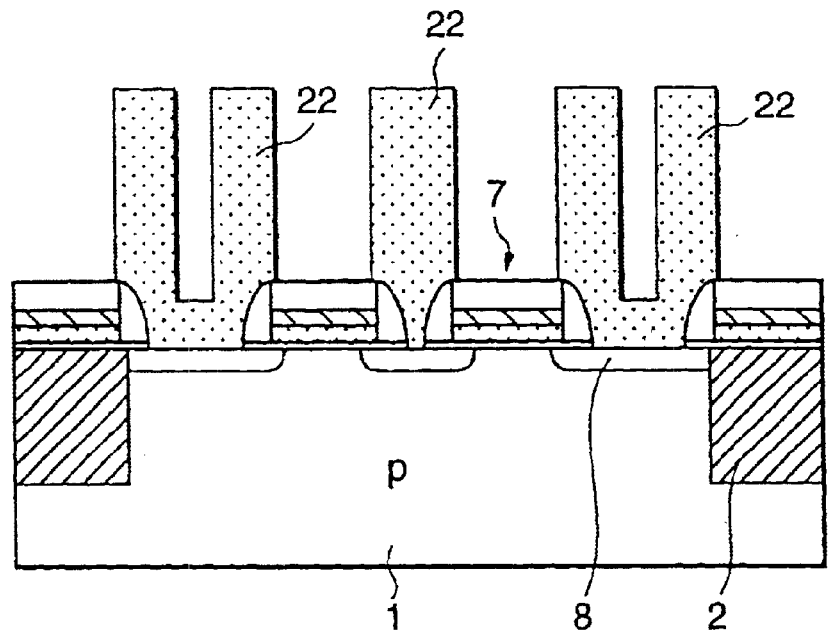
FIGS. 10A and 10B are sectional views arranged in order of steps and showing a manufacturing process according to a third embodiment of the invention.
Figure 10B:
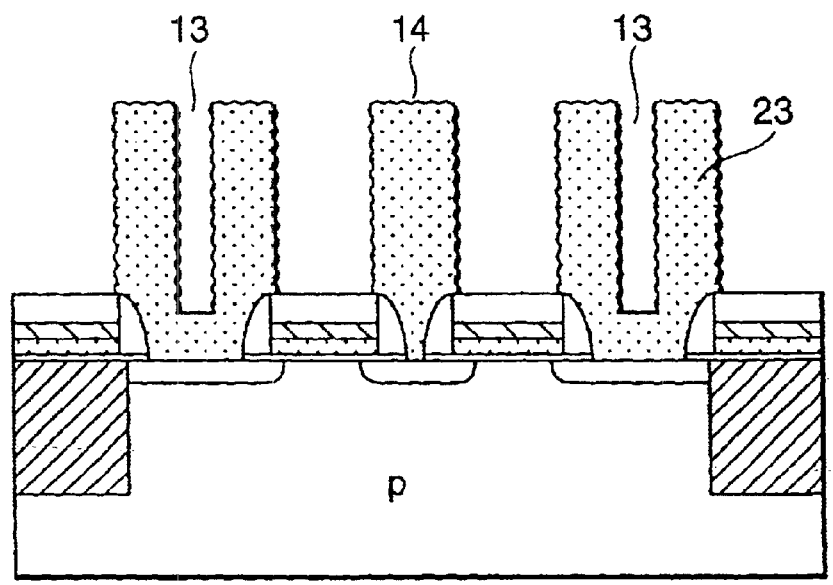

FIGS. 10A and 10B are sectional views that are arranged in order of steps and show a manufacturing process according to a third embodiment of the invention. A plan view of a semiconductor device according to the third embodiment is the same as the plan view (i.e., FIG. 1) of the semiconductor device according to the first embodiment, and the sectional views of FIGS. 10A and 10B are taken along line II~X—II~X in FIG. 1. In this embodiment, phosphorus-doped amorphous silicon 22 is deposited instead of polysilicon. 11 that is deposited in the step of FIG. 3B in the first embodiment. As shown in FIG. 10A, the steps of processing a deposited amorphous silicon film 22 into storage electrodes and a bit contact plug are the same as the steps of FIGS. 2A to 5A in the first embodiment. After the processing has been performed as shown in FIG. 10A, the same HSG treatment as in the second embodiment is performed, whereby.the amorphous silicon films 22 are converted into HSG layers 23 having fine asperity on their surfaces as shown in FIG. 10B.

Then, capacitor insulating films, counter electrodes, an interlayer insulating film, and a bit line are formed by the same steps as shown in FIG. 5B to FIG. 7 of the first embodiment.

Fourth Embodiment

Figure 11:
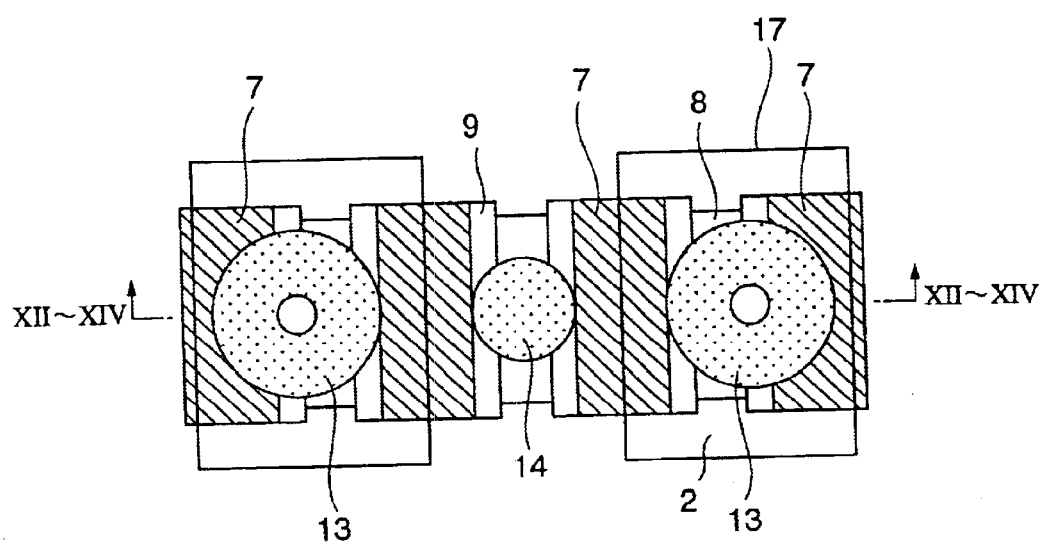
FIG. 11 is a plan view of a semiconductor device according to a fourth embodiment of the invention.

FIGS. 11 to 14F show a fourth embodiment of the invention. That is, FIG. 11 is a plan view of a semiconductor device, and FIGS. 12A to 14B are sectional views taken along line X II~X I V—X II~X I V in FIG. 11 and arranged in order of steps of a manufacturing process. In FIG. 11, the constituent elements having corresponding constituent elements in FIG. 1 are given the same reference numerals as the latter and redundant descriptions therefor will be omitted. In this embodiment, the interval between the gate electrodes 7 on both sides of each concave storage electrode 13 is set the same as the interval between the gate electrodes 7 on both sides of the convex bit contact plug electrode 14. Further, in this embodiment, each concave storage electrode 13 overlaps, over a long length, with the gate electrode 7 on the device isolation oxide film 2 and the diameter of each concave storage electrode 13 is set larger than that of the convex bit contact plug electrode 14. This enables simultaneous formation of the concave storage electrodes 13 and the convex bit contact plug electrode 14 as in the case of the first to third embodiments.

Next, the manufacturing process according to the fourth embodiment will be described with reference to FIGS. 12A to 14B.

Figure 12A:
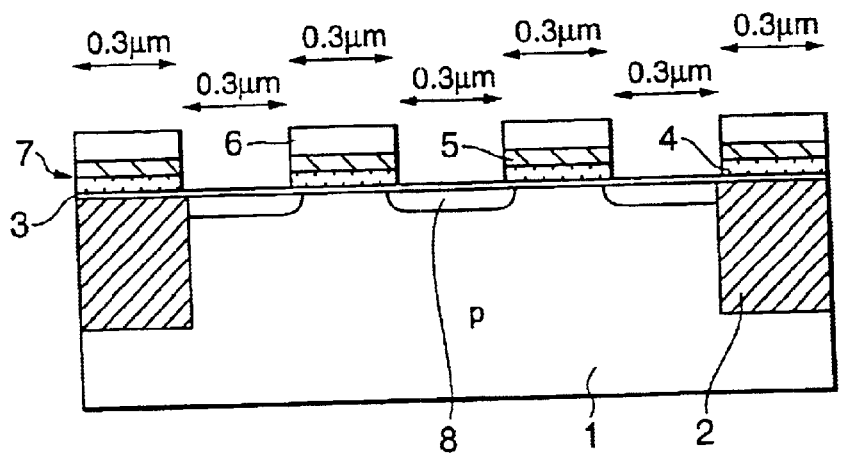
FIGS. 12 to 14 are sectional views arranged in order of steps and showing a manufacturing process according to the fourth embodiment of the invention.

As shown in FIG. 12A, a 500-nm-thick device isolation oxide films 2 are formed on a p-well region 1 by a known isolation technique. Then, a 10-nm-thick gate oxide film 3 is formed by thermal oxidation, and a 100-nm-thick polysilicon film 4, a 100-nm-thick tungsten silicide film 5, and a 200-nm-thick SiN film 6 are deposited thereon sequentially by CVD. Then, gate electrodes 7 are formed by patterning these three deposition films by photolithography and dry etching. At this time, the length of each gate electrode 7 is set at 0.3 µm and the distance between the gate electrodes 7 is also set at 0.3 µm. After the formation of the gate electrodes 7, source/drain diffusion layers 8 are formed by implantation of phosphorus or arsenic ions.

Figure 12B:
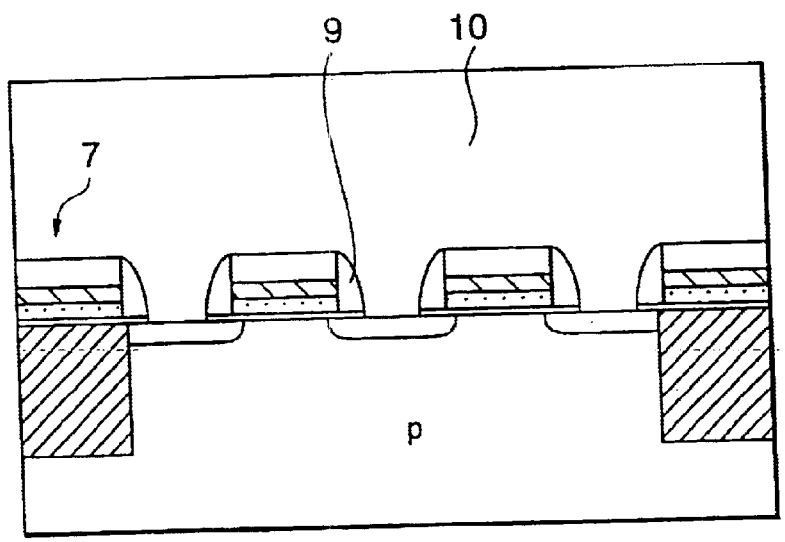

Thereafter, as shown in FIG. 12B, after SiN film sidewalls 9 having a width of 0.1 µm are formed, an $SiO_2$ film 10 is deposited by plasma CVD. Then, the surface of the $SiO_2$ film 10 is planarized by CMP so that the height of the planarized $SiO_2$ film 10 as measured from the diffusion layers 8 is set at about 800 nm.

Figure 13A:
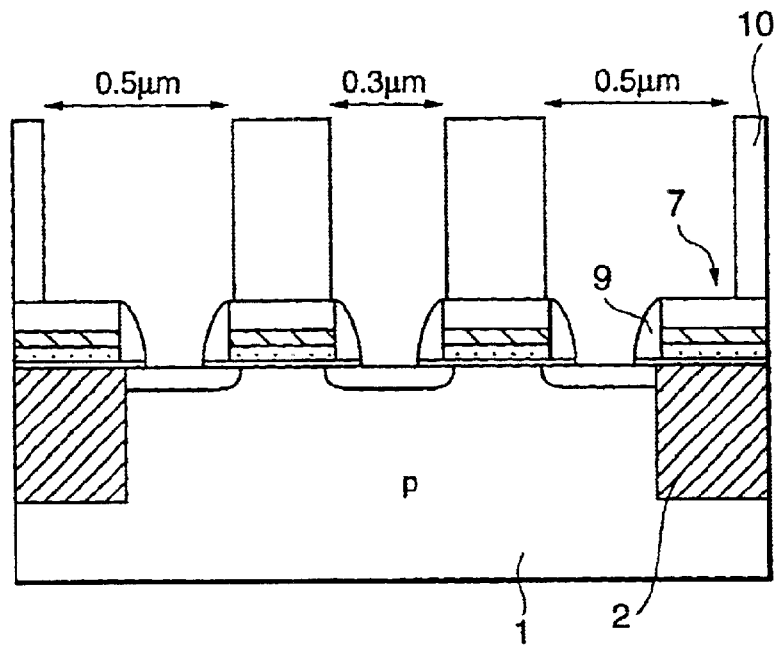

Thereafter, as shown in FIG. 13A, the portions of the $SiO_2$ film 10 in the regions where concave storage electrodes 13 and a convex bit contact plug electrode 14 (see FIG. 11) are to be formed are removed selectively by photolithography and dry etching. The diameter of resulting concave.storage electrode forming holes and the diameter of a resulting convex bit contact plug electrode forming hole are set at 0.5 µm and 0.3 µm, respectively.

Figure 13B:
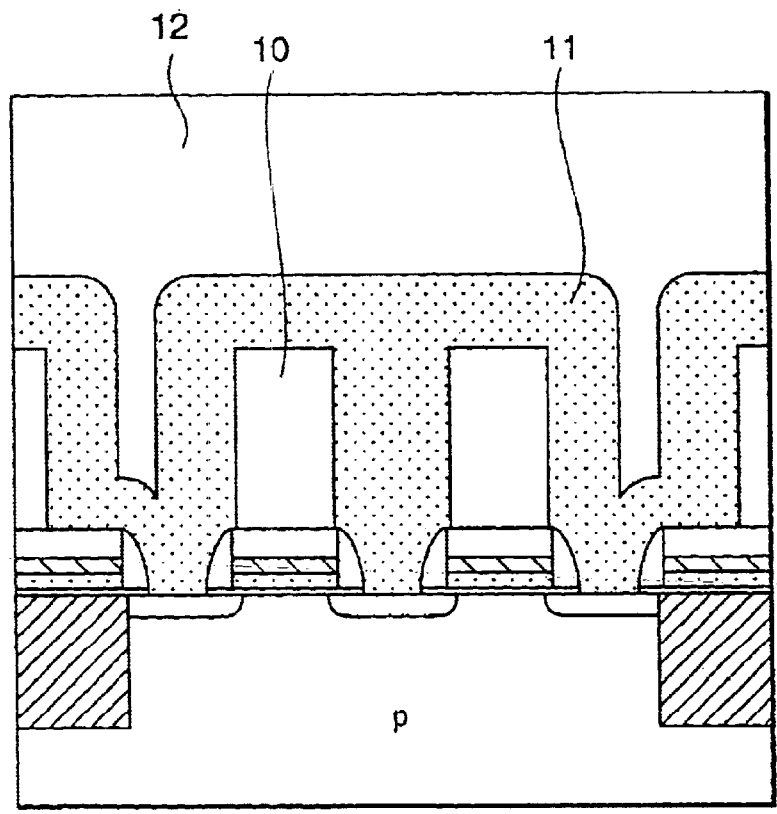

Then, as shown in FIG. 13B, a phosphorus-doped polysilicon film 11 is deposited at a thickness of 200 nm by LP-CVD. As a result, the polysilicon film 11 is formed in cylinder form in holes for forming the storage electrode while a hole for forming the bit contact plug is completely filled with the polysilicon film 11. An $SiO_2$ film 12 is then deposited on the entire surface by plasma CVD.

Figure 14A:
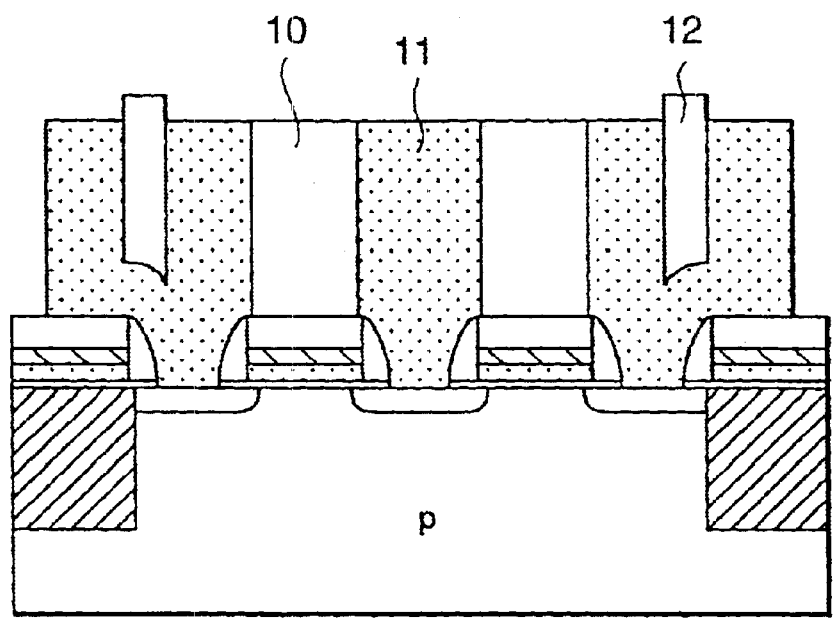

Then, as shown in FIG. 14A, etch back is performed on the entire surface of the $SiO_2$ film 12 until the surfaces of the polysilicon film 11 are exposed. Then, etch back is performed on the entire surfaces of the polysilicon film 11 until the surfaces of the $SiO_2$ films 10 are exposed.

Figure 14B:
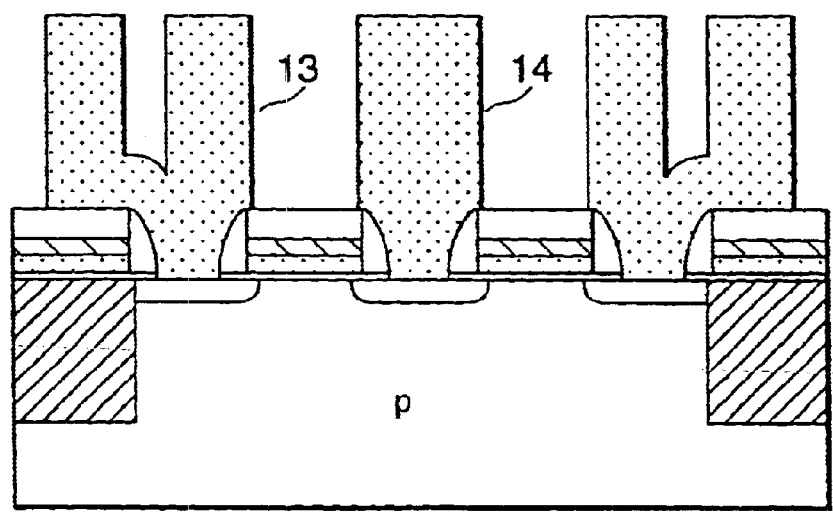
Figure 15:
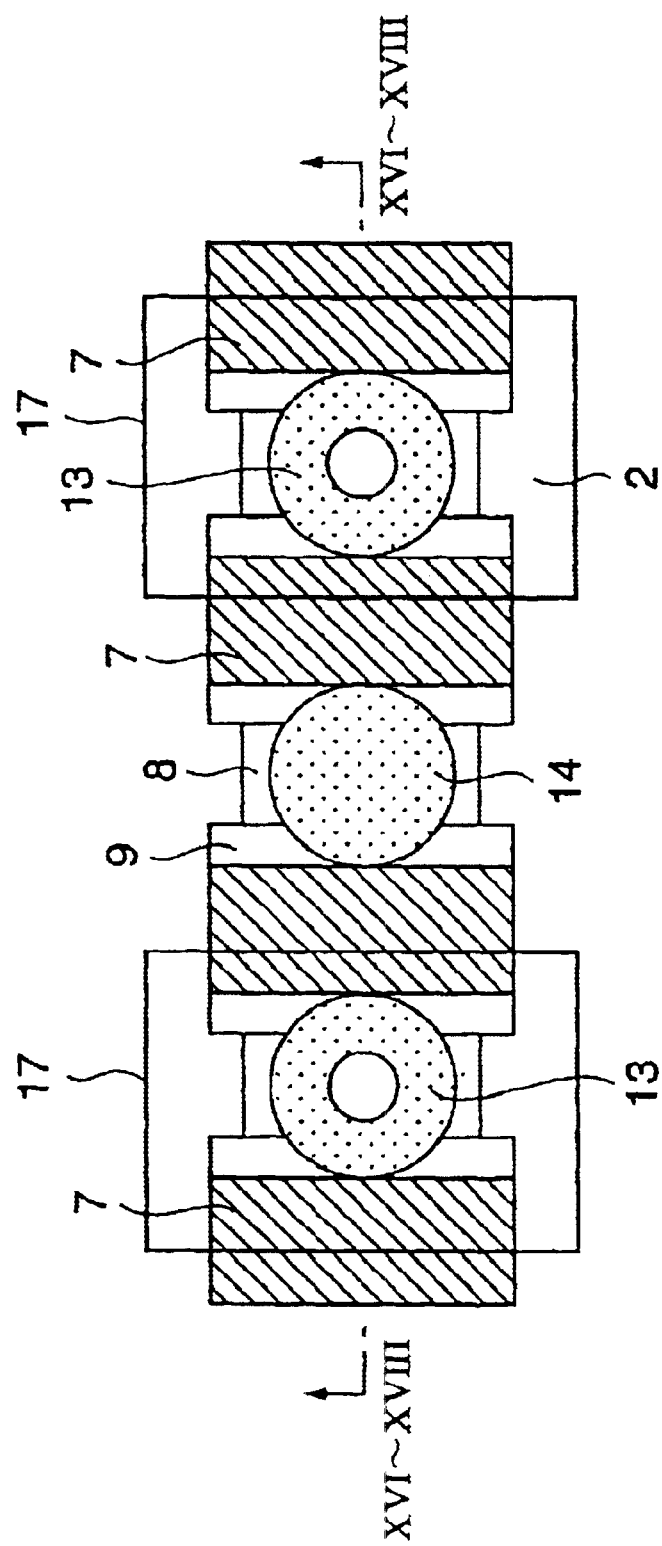
FIG. 15 is a plan view of a conventional example.
Figure 16A:
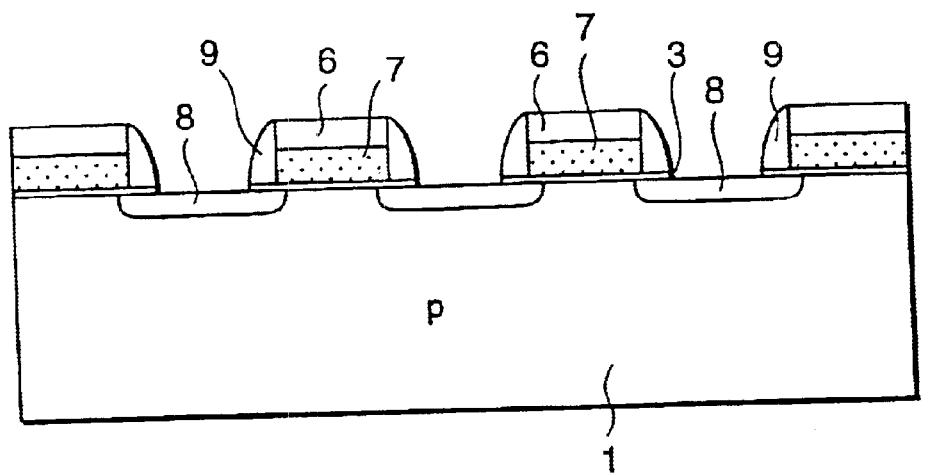
FIGS. 16 to 18 are sectional views arranged in order of steps and showing a manufacturing process of the conventional example of FIG. 15.
Figure 16B:
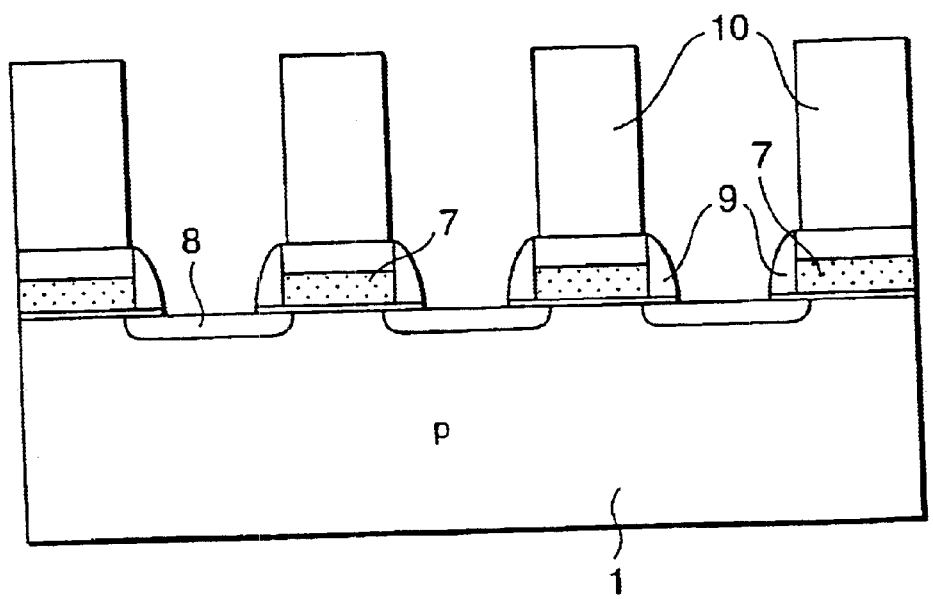
Figure 17A:
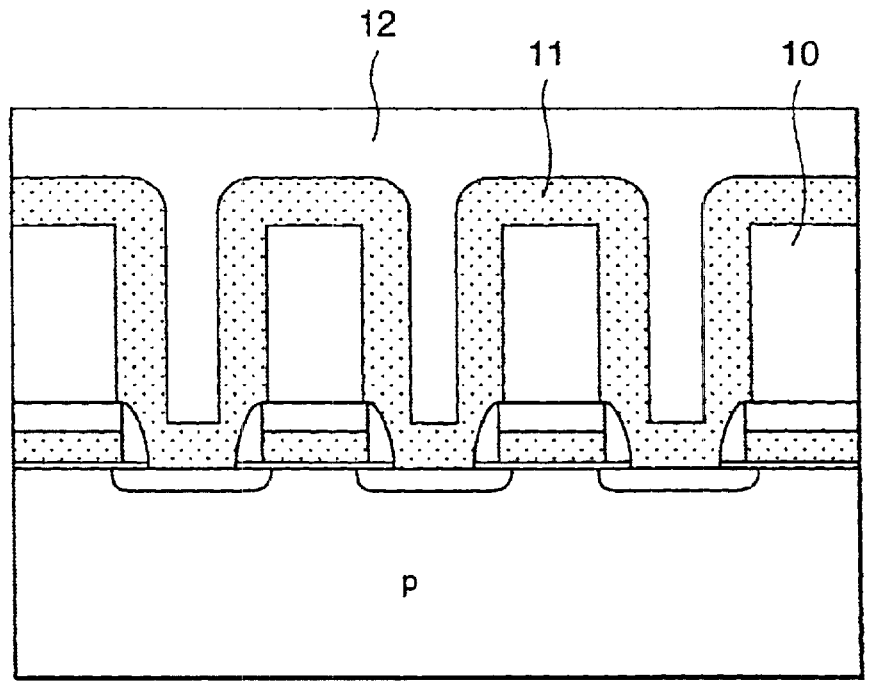
Figure 17B:
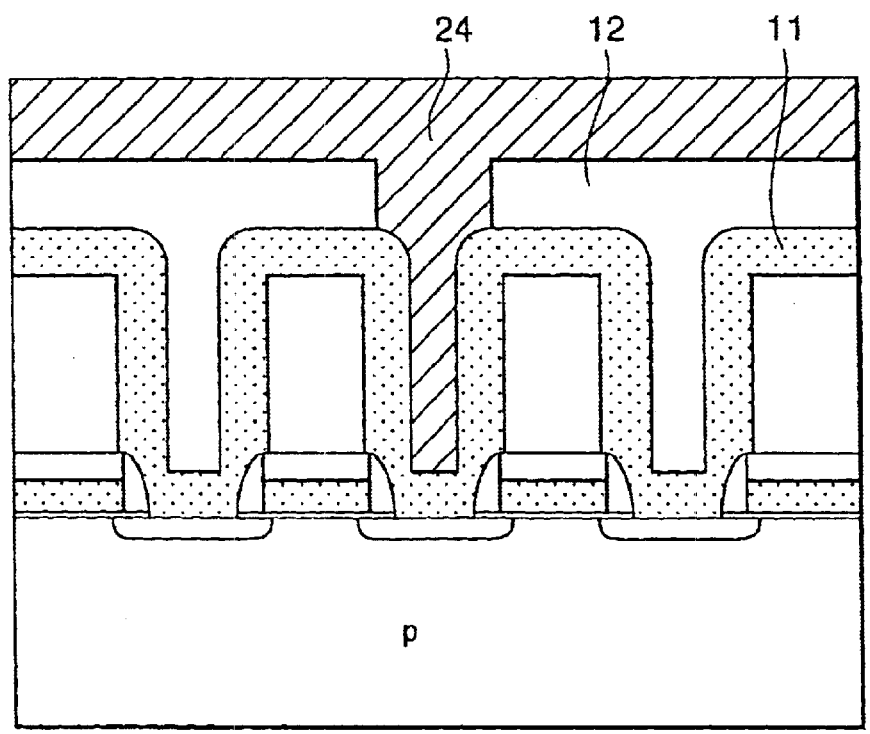
Figure 18A:
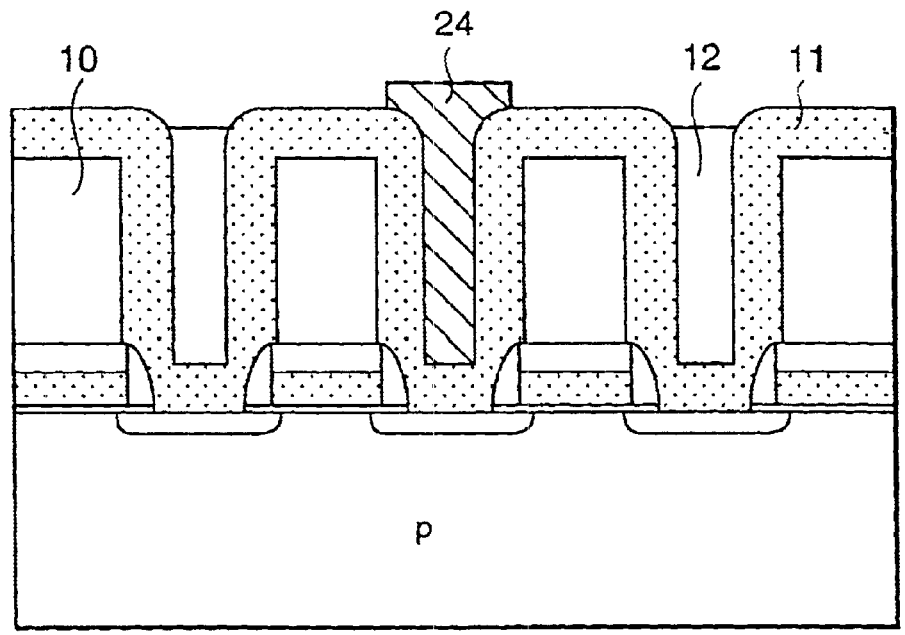
Figure 18B:
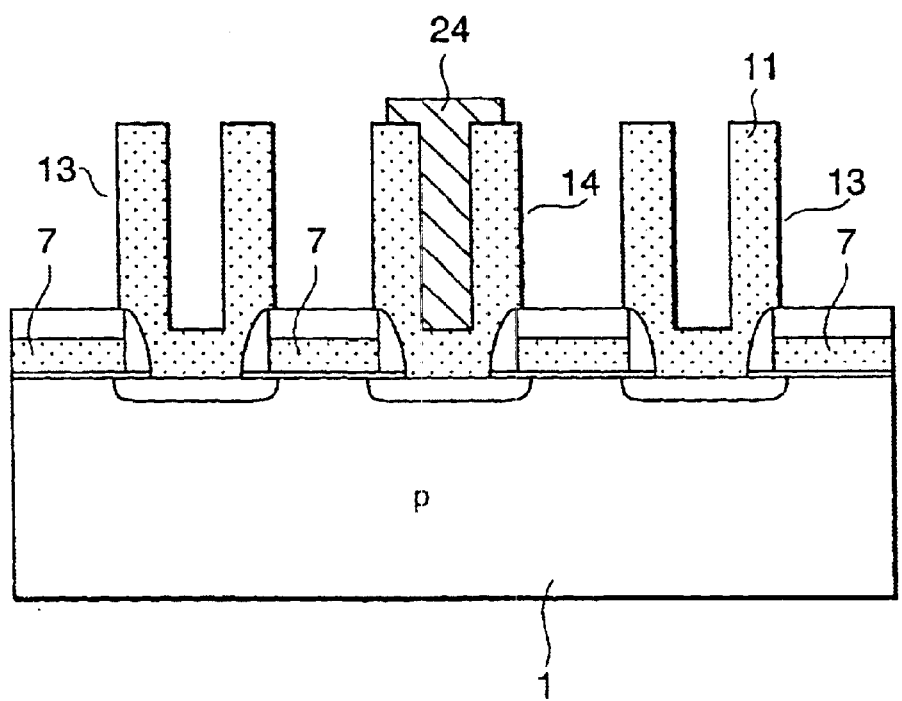

Subsequently, as shown in FIG. 14B, the residual portions of the $SiO_2$ films 10 and 12 are completely removed by wet etching. As a result, cylinder-shaped concave storage electrodes 13 and a convex bit contact plug electrode 14 are formed at the same time.

Then, capacitor insulating films, counter electrodes, an interlayer insulating film, and a bit line are formed by the same steps as in the first embodiment.

The fourth embodiment can make the interval between the gate electrodes on both sides of each cylinder-shaped storage electrode smaller than in the first embodiment, and has an advantage that the cell size can be reduced.

While preferred embodiments of the present invention have been described, it is to be understood that the invention is to be defined by appended claims when read in light of the specification and when accorded their full range of equivalent. For example, the storage electrodes and the bit contact plug may be formed by using a material other than polysilicon, such as W or TiN. It is possible to form HSG layers on the side faces of films of such a material other than polysilicon. The concave storage electrodes and the convex bit contact plug electrode need not always be shaped like a circular concave cylinder or a cylindrical convex pole, and may assume a rectangular concave cylinder or a rectangular convex pole. Further, the CVD film planarization technique may be etch back rather than CMP.

As described above, according to the invention, a convex bit contact plug electrode and cylinder-shaped concave storage electrodes can be formed simultaneously by a complete self-alignment process. That is, steps for forming only a bit contact plug that are necessary in the conventional manufacturing process can be eliminated; one photolithography step, one selective etching step, one polysilicon film growing step, and one polysilicon film etch back step can be eliminated. Therefore, according to the invention, since there is no photolithography step, it is no longer necessary to provide margins for mask alignment errors. As a result, the invention not only contributes to miniaturization and increase in integration density of semiconductor devices but also enables reduction of the manufacturing cost of DRAMS etc. and shortening of the TAT.

What is claimed is:

1. A method of manufacturing a semiconductor device comprising:

forming a MOS transistor on the semiconductor substrate;

forming a spacer layer on said transistor and said semiconductor substrate;

opening a first and a second windows from surface of said spacer layer to a source and a drain regions of said MOS transistor, the internal diameter of said first window being greater than the internal diameter of said second window;

forming a conductive layer on said spacer layer, and the inside of said first and second windows so as to fill up the inside of said second window by said conductive layer and to remain concave hollow portion in said first window; and removing said conductive layer on said spacer layer and said spacer layer to form a concave electrode by said conductive layer in said first window and a convex electrode by said conductive layer in said second window.

2. The method of claim 1, further comprising:

selectively forming a dielectric film on said concave electrode and an opposite electrode on said dielectric film to form a capacitor; and selectively forming a wiring layer to contact with top of said convex electrode.

3. The method of claim 1, wherein the step of forming a conductive layer on said spacer layer and the inside of said first and second windows deposits conductive material on said spacer layer and the inner surface of said first and second windows by low-pressure chemical vapor deposition.

4. The method of claim 1, further comprising:

depositing a doped amorphous silicon film on said concave electrode; and changing surface layer of said doped amorphous silicon film on said concave electrode into an Hemi-Sperical Grained silicon layer.

5. The method of claim 1, further comprising:

changing surface layer of said concave electrode into an Hemi-Sperical Grained silicon layer.

6. The method of claim 1, wherein said MOS transistor comprises a gate electrode; wherein removing said spacer layer is performed until a surface of said gate electrode is exposed.

7. The method of claim 6, further comprising:

Selectively forming a dielectric film on said concave electrode and on at least a part of said gate electrode, and forming an opposite electrode on said dielectric film to form a capacitor.

8. The method of claim 6, wherein the step of removing said spacer layer comprises a wet etching process.

* * * * *